(12) United States Patent
Takasu

(10) Patent No.: US 7,710,482 B2
(45) Date of Patent: May 4, 2010

(54) SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 337 days.

(21) Appl. No.: 11/818,292

(22) Filed: Jun. 14, 2007

(65) Prior Publication Data

US 2007/0291148 A1    Dec. 20, 2007

(30) Foreign Application Priority Data

Jun. 16, 2006  (JP) .............................. 2006-166878

(51) Int. Cl.
*H04N 3/14*  (2006.01)
*H04N 5/335*  (2006.01)

(52) U.S. Cl. ..................... 348/308; 348/294; 250/208.1

(58) Field of Classification Search ................. 348/294, 348/302, 308; 250/208.1
See application file for complete search history.

(56) References Cited

U.S. PATENT DOCUMENTS

2003/0160887 A1 * 8/2003 Takahashi .................... 348/350
2004/0005729 A1 * 1/2004 Abe et al. ..................... 257/53
2004/0036010 A1 * 2/2004 Hsieh et al. ............. 250/208.1
2007/0092984 A1 * 4/2007 Lee ............................. 438/57

* cited by examiner

*Primary Examiner*—Gevell Selby
(74) *Attorney, Agent, or Firm*—Adams & Wilks

(57) ABSTRACT

A MOS image sensor IC has a silicon substrate, a MOS transistor and photodiodes disposed on the silicon substrate, and pixel regions each comprising one of the photodiodes. A protective film is disposed around the pixel regions. A first conductor for potential fixation is disposed under the protective film and surrounds the pixel regions. The first conductor is electrically fixed to a potential of the silicon substrate.

13 Claims, 2 Drawing Sheets

SEMICONDUCTOR DEVICE

BACKGROUND OF THE INVENTION

1. Field of the Invention

The present invention relates to a MOS image sensor IC used for capturing and electrically transmitting image information in an apparatus such as a facsimile, an image scanner, and a digital camera.

2. Description of the Related Art

A circuit diagram of a conventional MOS image sensor is shown in FIG. 4 as an example. In a sensor circuit 10 of the MOS image sensor, a photodiode 12 with a PN junction is connected to a reset transistor 11 serving as a switching element for resetting the photodiode 12 to an appropriate voltage, and to an amplifier 13 for amplifying photoelectric charges accumulated in the photodiode 12.

Continuous capture of optical information can be carried out through operations including: reset operation in which the reset transistor 11 is turned on to hold the photodiode 12 at a reset voltage; accumulation operation in which the reset transistor 11 is turned off to accumulate photoelectric charges in the photodiode 12 for a certain period of time; and read operation in which the amplifier circuit 13 is turned on to amplify the photoelectric charges accumulated in the photodiode 12 to read.

A holding circuit 20, including two switching transistors (22A and 22B) and a capacitive element 21, permits temporary storage of a signal which has been amplified after the read operation.

The switching transistor 22A is turned on during the read operation to store the signal into a holding capacitor 21 as an electric charge through the amplifier 13, and the switching transistor 22A is turned off. The switching transistor 22B is then turned on after an arbitrary holding time to permit the signal reading from the holding capacitor 21.

A series of reset operation, accumulation, and read operation are collectively performed on a plurality of photodiodes to permit arbitrary and independent signal reading from the holding circuit.

Photoelectric conversion, whose characteristic is one of the most important characteristic, is performed in accordance with the intensity of incident light to the photodiode 12.

For improvement of the photoelectric conversion characteristic, JP 2004-312039 A (FIG. 24), for example, discloses a photoelectric conversion element in which occurrence of a defect is suppressed in a semiconductor region in which a depletion layer is formed inside the photodiode 12.

The image sensor IC having a plurality of pixels formed in a single chip, however, shows a problem in which variation in photoelectric conversion characteristic of a plurality of photodiodes 12, which constitutes the plurality of pixels, occurs due to the change in the intensity of the incident light caused by variation in thickness of a protective film formed on an upper surface of the photodiodes 12.

Countermeasures for the problem have been proposed: for example, planarization after the formation of the protective film and the formation of a second protective film so as to further make the film thickness uniform. There still exist problems that, for example, the number of processes is increased to thereby increase manufacturing costs, and that the sufficient uniformity in film thickness cannot be obtained.

SUMMARY OF THE INVENTION

In order to solve the above-mentioned problems, the present invention provides a MOS image sensor having the following configuration.

According to the present invention, there is provided a MOS image sensor IC comprising: a silicon substrate; a photodiode which forms a pixel region; a MOS transistor, the photodiode and the MOS transistor being formed on the silicon substrate; and first conductors for potential fixation provided so as to surround a plurality of pixel regions under a protective film formed around the plurality of pixel regions, in which the first conductors each are fixed to the same potential. Alternatively, in the MOS image sensor IC, the plurality of pixel regions include, under the protective film, second conductors for potential fixation that are each formed in a narrow shape so as not to block light incident on the photodiodes, and are electrically connected to each other so that the second conductors each have the same potential. Alternatively, in the MOS image sensor IC, the conductors are electrically connected to each other so that the conductors each have a potential equal to that of the silicon substrate.

With these means, the potential of the regions onto which the protective film is formed over the whole pixel regions can be fixed substantially constant. Forming speed and the quality of the protective film formed on each pixel region can thus be held constant, and the protective film formed on each pixel region has a substantially uniform thickness and quality.

Accordingly, maintaining the intensity of the incident light to the photodiodes of the pixel regions to be constant is enabled, suppressing the variation in photoelectric conversion characteristic of pixels, which permits the realization of a MOS image sensor IC having a uniform photoelectric conversion characteristic over the whole IC.

DETAILED DESCRIPTION OF THE PREFERRED EMBODIMENTS

Figure 1:
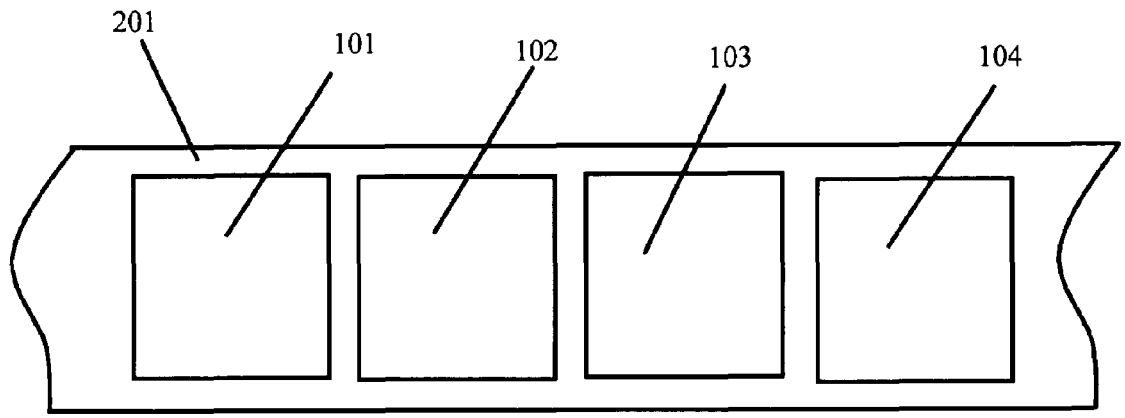
FIG. 1 is a schematic plan view showing a first embodiment in pixel areas of a MOS image sensor according to the present invention.

FIG. 1 is a schematic plan view showing a first embodiment in pixel regions of a MOS image sensor according to the present invention.

A plurality of pixel regions 101, 102, 103, and 104 are each surrounded by a conductor 201 for potential fixation which is made of aluminum or the like. The conductor 201 surrounding the pixel regions 101, 102, 103, and 104 is electrically connected and has the same potential. Though not shown in the figure, the conductor 201 is electrically connected to have a potential equal to a substrate potential of a silicon substrate on which the MOS image sensor is formed. The potential of the regions onto which the protective film is formed over the whole pixel regions can be kept substantially constant in the MOS image sensor IC when a protective film is formed after a metal line process for aluminum or the like. Accordingly, forming speed and the quality of the protective film formed on the pixel regions can be held constant, and the protective film formed on the pixel regions has a substantially uniform thickness and quality. Maintaining the intensity of the incident light to the photodiodes of the pixel regions to be constant is enabled, suppressing the variation in photoelectric conversion characteristic of pixels, which permits the realization of a MOS image sensor IC having a uniform photoelectric conversion characteristic over the whole IC.

Figure 2:
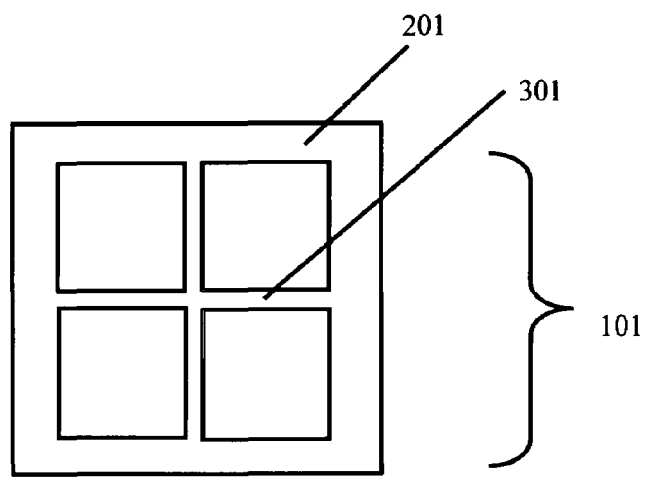
FIG. 2 is a schematic plan view showing a second embodiment in the pixel area of the MOS image sensor according to the present invention.

FIG. 2 is a schematic plan view showing a second embodiment in a pixel region of the MOS image sensor according to the present invention.

The second embodiment is different from the first embodiment; in addition to the conductor 201 for potential fixation which surrounds the pixel region 101 and is made of aluminum or the like, a conductor 301 for potential fixation, which is formed in a narrow shape so as not to block incident light and is made of aluminum or the like, is formed in a cross shape in one pixel region 101.

Formation of an additional conductor for fixing the potential in the pixel region 101 is a counter measure to large a area of the pixel region 101, which may prevent sufficient pinning of the potential of the pixel region 101 in some cases only by the use of the conductor 201 for potential fixation surrounding the pixel region 101 and made of aluminum or the like.

In this case, formation of the conductor 301 in the narrowest possible shape is desirable not to block the incident light to the pixel region 101. In addition, similar to the first embodiment, it is desirable that the conductor 301 is electrically connected to have the same potential as the silicon substrate on which a MOS image sensor is formed. Other components shown in FIG. 2 that are identical with those of FIG. 1 are denoted by the same reference numerals, and explanations thereof are omitted.

Figure 3:
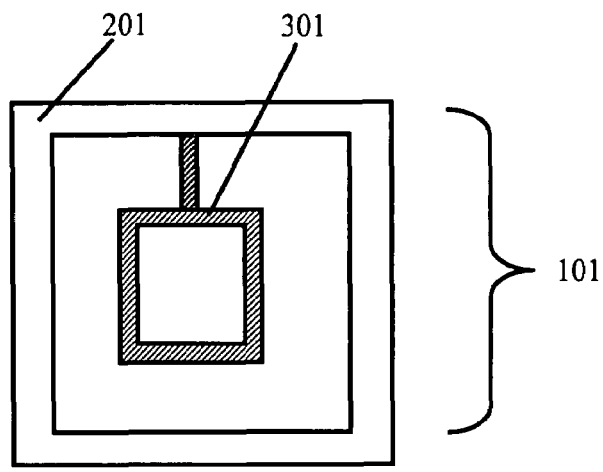
FIG. 3 is a schematic plan view showing a third embodiment in the pixel area of the MOS image sensor according to the present invention.
Figure 4:
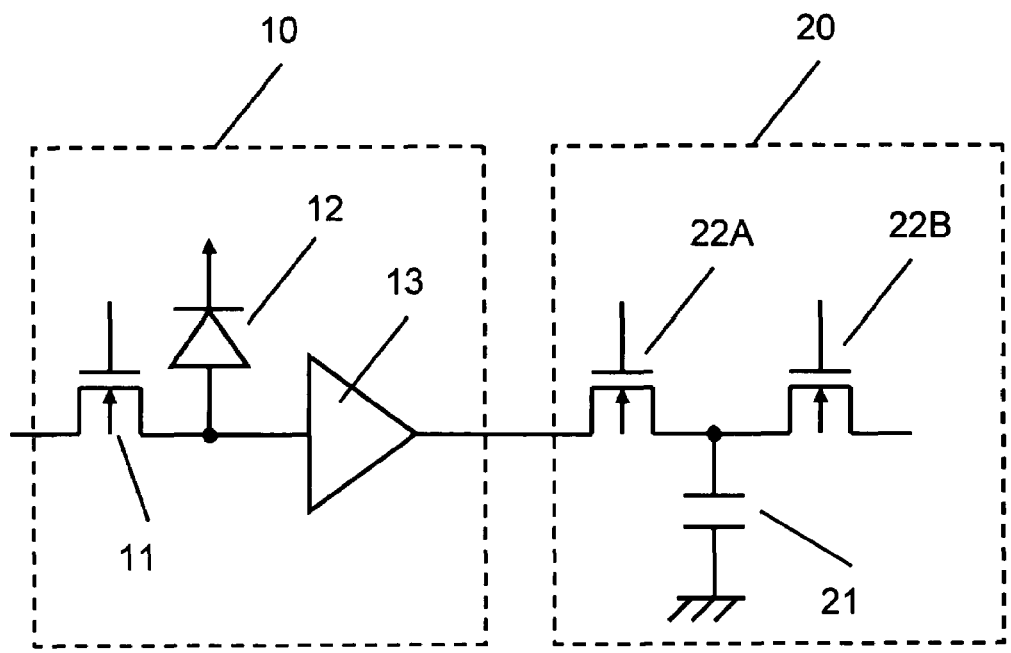
FIG. 4 is a circuit diagram showing an example of a conventional MOS image sensor.

FIG. 3 is a schematic plan view showing a third embodiment in the pixel area of the MOS image sensor according to the present invention.

The third embodiment is different from the second embodiment; in one pixel region 101, the conductor 301 for fixing the potential, which is formed in a narrow shape so as not to block the incident light and is made of aluminum or the like, is not formed in a cross but is formed in combination of a narrow line extending to an inside of the pixel region 101 and a polygon made of conductor strips.

Also in the third embodiment, formation of an additional conductor for fixing the potential in the pixel region 101 is a counter measure to a large area of the pixel region 101, which may prevent sufficient pinning of the potential of the pixel region 101 in some cases only by the use of the conductor 201 for potential fixation surrounding the pixel region 101 and made of aluminum or the like, and has the same purpose as in the second embodiment.

Other components shown in FIG. 3 that are identical with those of FIG. 2 are denoted by the same reference numerals, and explanations thereof are omitted.

As described above, in the second and third embodiments, an example has been described in which, in addition to the conductor 201 for potential fixation, in one pixel region 101, the conductor 301 for potential fixation, which is formed in a narrow shape so as not to block the incident light and is made of aluminum or the like, is formed in combination of some figures. The conductor can have another shape. For simplification, description has been made by explaining only the pixel region 101. Alternatively, in the plurality of pixel regions as a whole, the conductor 301 for potential fixation, which is made of aluminum or the like, is formed in the same shape.

What is claimed is:

1. A MOS image sensor IC, comprising:
    a silicon substrate;
    a MOS transistor and a plurality of photodiodes disposed on the silicon substrate;
    a plurality of pixel regions each comprising a photodiode of the plurality of photodiodes;
    a protective film disposed around the plurality of pixel regions; and
    a first conductor for potential fixation disposed under the protective film and surrounding the plurality of pixel regions, the first conductor being electrically fixed to a potential of the silicon substrate.

2. A MOS image sensor IC according to claim 1; further comprising a plurality of second conductors for potential fixation disposed under the protective film in each pixel region, each of the second conductors having a narrow shape so as not to block incident light to the corresponding pixel region and being electrically fixed to the potential of the silicon substrate.

3. A MOS image sensor IC according to claim 1; wherein the first conductor is made of aluminum.

4. A MOS image sensor IC according to claim 2; wherein the second conductors are made of aluminum.

5. A MOS image sensor IC according to claim 2; wherein each of the second conductors is cross-shaped.

6. A MOS image sensor IC according to claim 2; wherein each of the second conductors comprises a plurality of conductor strips.

7. A MOS image sensor IC according to claim 6; wherein the plurality of conductor strips form a polygon shape.

8. A MOS image sensor IC comprising:
    a silicon substrate;
    a MOS transistor and a plurality of photodiodes disposed on the silicon substrate;
    a plurality of pixel regions each comprising a photodiode of the plurality of photodiodes;
    a protective film disposed around the plurality of pixel regions;
    a first conductor for potential fixation disposed under the protective film and surrounding the plurality of pixel regions, the first conductor being electrically fixed to a potential of the silicon substrate; and
    a plurality of second conductors for potential fixation disposed under the protective film in each pixel region, each of the second conductors having a narrow shape so as not to block incident light to the corresponding pixel region.

9. A MOS image sensor IC according to claim 8; wherein each of the second conductors is cross-shaped.

10. A MOS image sensor IC according to claim 8; wherein each of the second conductors comprises a plurality of conductor strips.

11. A MOS image sensor IC according to claim 10; wherein the plurality of conductor strips form a polygon shape.

12. A MOS image sensor IC according to claim 8; wherein the second conductors are made of aluminum.

13. A MOS image sensor IC according to claim 8; wherein the first conductor is made of aluminum.

* * * * *